(12) United States Patent
Kim et al.

(10) Patent No.: US 6,312,839 B1
(45) Date of Patent: Nov. 6, 2001

(54) BLUE-LIGHT EMITTING COMPOUND AND DISPLAY DEVICE ADOPTING THE SAME AS COLOR DEVELOPING SUBSTANCE

(75) Inventors: Dong-hyun Kim, Suwon; Han-sung Yu, Anyang; Soon-ki Kwon; Dong-cheol Shin, both of Chinju; Yun-hi Kim, Pusan, all of (KR)

(73) Assignee: Samsung Display Devices Co., Ltd., Suwon (KR)

( * ) Notice: Subject to any disclaimer, the term of this patent is extended or adjusted under 35 U.S.C. 154(b) by 0 days.

(21) Appl. No.: 09/568,021

(22) Filed: May 10, 2000

(30) Foreign Application Priority Data

May 31, 1999 (KR) .................................................. 99-19759

(51) Int. Cl.[7] ............................ H05B 33/14; C09K 11/06
(52) U.S. Cl. ......................... 428/690; 428/917; 313/504; 313/506; 252/301.16; 556/432
(58) Field of Search .................................... 428/690, 917; 313/504, 506; 252/301.16; 556/432

(56) References Cited

U.S. PATENT DOCUMENTS 5,876,864 * 3/1999 Kim et al. ............................ 428/690

\* cited by examiner

*Primary Examiner*—Cynthia H. Kelly
*Assistant Examiner*—Dawn L. Garrett
(74) *Attorney, Agent, or Firm*—Leydig, Voit & Mayer, Ltd.

(57) ABSTRACT

A blue-light emitting compound having fluorene side chains and an organic electroluminescence (EL) device adopting the blue-light emitting compound as a color developing substance. The blue-light emitting compound with fluorene side chains has the formula (1)

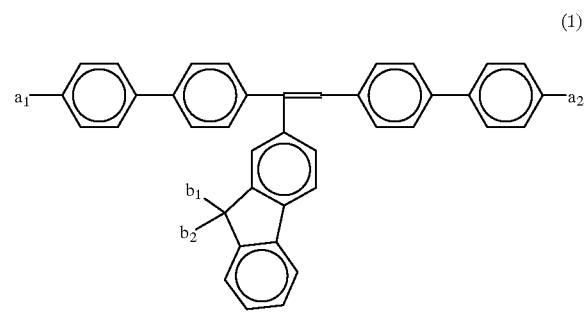

(1)

The compound having the formula (1) hereinabove, as a blue light-emitting substance, is useful as a color developing substance for a display device with improved emission efficiency. The organic EL device adopts the compound having the formula (1) for its organic layer, for example, the emitter layer, which results in improved emission efficiency and luminance, compared to common blue light-emitting compounds.

17 Claims, 6 Drawing Sheets

BLUE-LIGHT EMITTING COMPOUND AND DISPLAY DEVICE ADOPTING THE SAME AS COLOR DEVELOPING SUBSTANCE

BACKGROUND OF THE INVENTION

1. Field of the Invention

The present invention relates to a blue-light emitting compound having fluorene side chains with superior emission efficiency, and a display device adopting the blue-light emitting compound as a color developing substance.

2. Description of the Related Art

Electroluminescence (EL) devices as a self-luminous type display give numerous advantages such as a broad viewing angle, a good contrast characteristic and a rapid response time. EL devices are classified into an inorganic EL device and an organic EL device depending on the material used for an emitter layer. In particular, the organic EL device has good luminance, turn-on voltage and response time characteristics and allows for full color display, compared to the inorganic EL device.

A general organic EL device includes an anode, a hole transporting layer, an emitter layer, an electron transporting layer and a cathode which are sequentially stacked on a substrate. The hole transporting layer, the emitter layer and the electron transporting layer are organic thin films formed of an organic compound.

The organic EL device having such a structure operates based on the following operational principle. As a voltage is applied between the anode and the cathode, holes injected from the anodes migrate through the hole transporting layer into the emitter layer. Meanwhile, electrons injected from the cathode migrate through the electron transporting layer into the emitter layer. In the emitter layer, excitons are generated by recombination of carriers, and transited from an excited state to ground state, so that fluorescent molecules of the emitter layer emit light, forming a picture.

An organic EL device adopting an aromatic diamine and aluminum complex having a low molecular weight has been developed by Eastman Kodak Company (Appl. Phys. Lett. 51, 913, 1987). Blue-light emitting substances, such as diphenylanthracene, tetraphenylbutadiene and distyryl benzene derivatives, have been disclosed, but their poor stability causes easy crystallization of thin films. EP 388,768 teaches diphenyldistyryl series blue-emitting materials with improved thin film stability, which hinders crystallization of thin film by adopting phenyl groups at its side chains. Also, distyrylanthracene derivatives, in which electron acceptors and electron donors coexist, have been developed by Kyushu University (Japan), which result in improved thin film stability (Pro. SPIE, 1910, 180 (1993)).

However, these blue light-emitting compounds lead to a reduction in the emission efficiency and need improvement of thin film stability, and thus a need for a novel blue-light emitting compound for blue-light emitting devices or full-color light-emitting devices, has increased.

SUMMARY OF THE INVENTION

It is an object of the present invention to provide a blue-light emitting compound with improved emission efficiency.

It is another object of the present invention to provide a display device adopting the blue-light emitting compound as a color developing substance.

The first object of the present invention is achieved by a blue light-emitting compound having fluorene side chains, the compound having the formula (1)

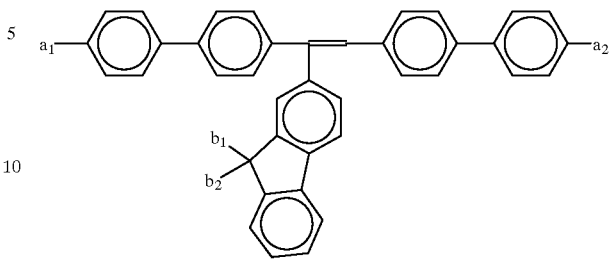

(1)

where $a_1$ and $a_2$ are independently selected from the group consisting of alkyl group of 1 to 20 carbon atoms, $-SiR_3$, and hydrogen; $b_1$ and $b_2$ are independently selected from the group consisting of alkyl group of 1 to 20 carbon atoms, aryl group of 6 to 20 carbon atoms, and $-SiR_3$; and R is alkyl group of 1 to 10 carbon atoms.

Preferably, $a_1$ and $a_2$ are independently selected from the group consisting of t-butyl group and trimethylsilyl; and $b_1$ and $b_2$ are independently selected from the group consisting of methyl, ethyl, propyl, butyl, pentyl, hexyl, heptyl, octyl, nonyl, decyl, dodecyl and phenyl groups.

The second object of the present invention is achieved by a display device adopting the light-emitting compound having fluorene side chains. An embodiment for the second object of the present invention provides an organic electroluminescence device adopting the light-emitting compound with fluorene side chains as a color developing substance.

To achieve the second object of the present invention, there is provided an organic electroluminescence device having an organic layer between a pair of electrodes, wherein the organic layer comprises the compound with fluorene side chains having the formula (1) hereinabove.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
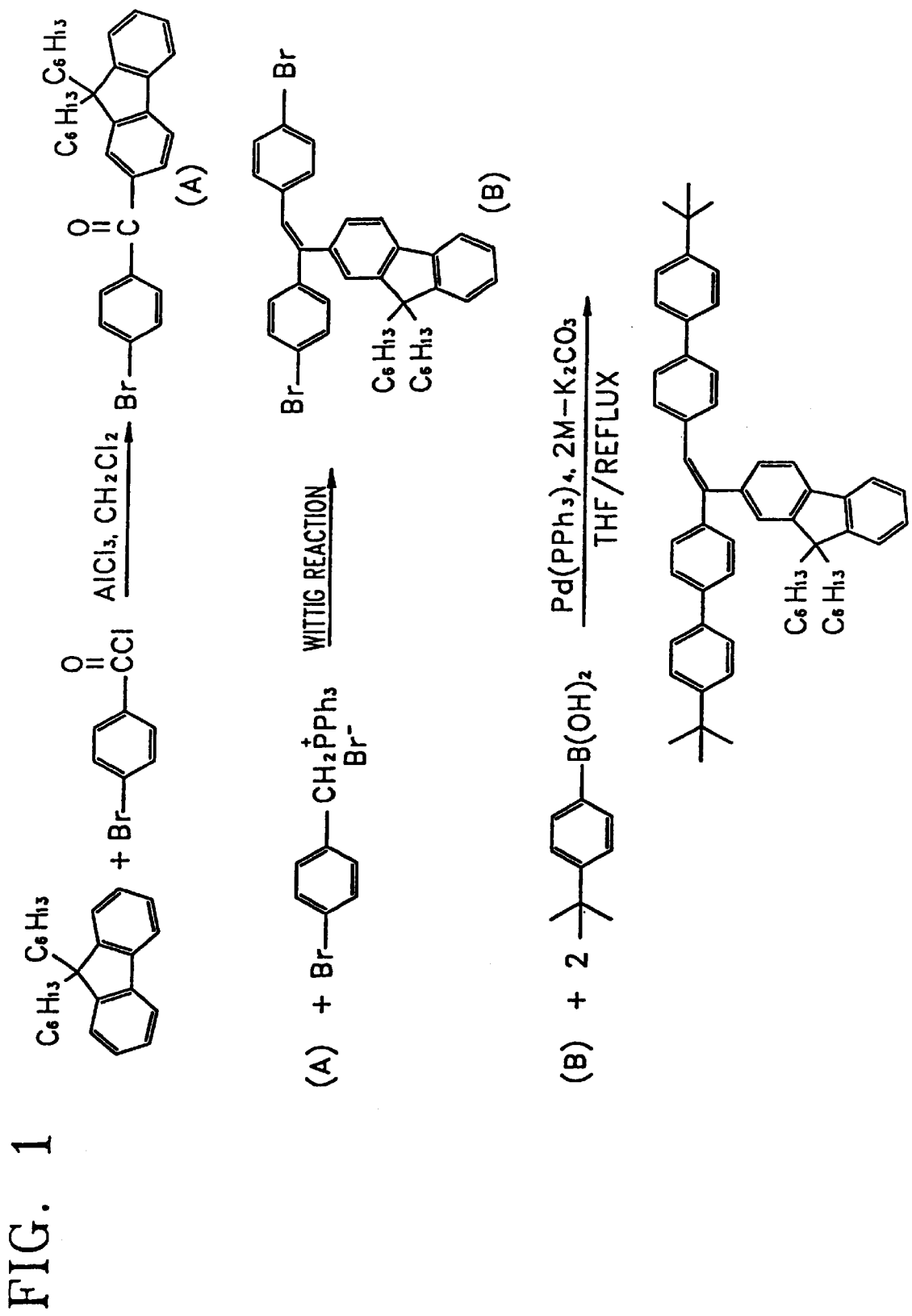
FIG. 1 illustrates a synthesis pathway of the compound having the formula (2)

In the blue-light emitting compound having the formula (1) hereinabove in accordance with the present invention, $a_1$ and $a_2$ may be both t-butyl group, and $b_1$ and $b_2$ are both hexyl group, which results in the compound having the formula (2) hereinbelow. $a_1$ and $a_2$ may be both trimethylsilyl group, and $b_1$ and $b_2$ are both hexyl group, which results in the compound having the formula (3) hereinbelow. Otherwise, $a_1$ and $a_2$ may be both hydrogen, and $b_1$ and $b_2$ are both hexyl group, which results in the compound having the formula (4) hereinbelow.

(2)

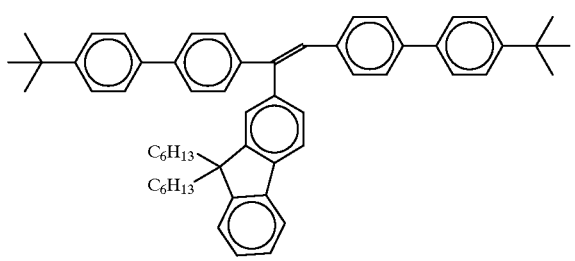

(3)

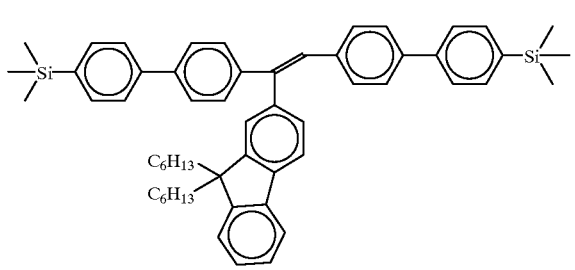

(4)

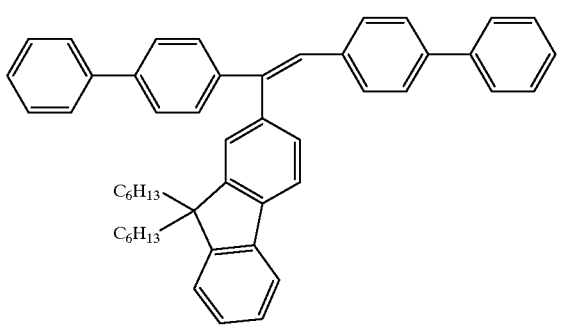

The compounds of the formulas (2), (3) and (4) have dihexylfluorene groups at their side chains. Dihexylfluorene groups prevent π-stacking with adjacent compounds, and in turn interaction of excitons, while avoiding a decrease in emission efficiency. Since dihexylfluorene group is distorted with respect to the main plane of the compound and the dihexyl groups of the dihexylfluorene stretch in opposite directions around the plane of dihexylfluorene group, which hinders crystallization of the compound as much as possible and improves thin film stability.

A method for manufacturing an organic EL device according to the present invention will be set forth below.

Initially, a substrate is coated with a material for an anode. Here, typical substrates for standard organic EL devices, such as a glass substrate or a transparent plastic substrate, which is satisfactory in view of transparency, surface smoothness, convenience in handling and wafer proofing characteristic. Also, the anode is formed of a transparent material with good conductivity, for example, of indium thin oxide (ITO), tin oxide ($SnO_2$), zinc oxide (ZnO).

Next, a material for a hole transporting layer is vacuum deposited or spin-coated on the anode to form the hole transporting layer. Any material may be selected for the hole transporting layer without restriction, but N, N'-bis(3-methylphenyl)-N,N'-diphenyl-[1,1'-biphenyl]-4,4'-diamine (TPD) or N, N'-di(naphthalene-1-yl)-N,N'-diphenyl-benzidine (α-NPD) is preferred for the same.

Then, the light-emitting compound having the formula (1) is vacuum deposited on the hole transporting layer to form an emitter layer, and a metal for a cathode is then vacuum deposited on the emitter layer, which results in a completed organic EL device. The cathode may be formed by vacuum depositing a single metal, for example, lithium (Li), magnesium (Mg), aluminum (Al) or calcium (Ca), or by simultaneously vacuum depositing two kinds of metal, for example, aluminum and lithium, magnesium and indium (In), or magnesium and silver (Ag).

Prior to the formation of the cathode, an electron transporting layer may be formed on the emitter layer with a typical material for the electron transporting layer. In addition, the organic EL device according to the present invention may further include an intermediate layer between two of the anode, the hole transporting layer, the emitter layer, the electron transporting layer and the cathode, for improved properties between corresponding two layers. For example, a hole injecting layer (HIL) may be further interposed between the anode and the hole transporting layer for improved adhesive strength between the hole transporting layer formed of, for example, α-NPD, and the anode formed of, for example, ITO. Also, the hole injection layer assists in injecting holes into the hole transporting layer from the anode.

Any material can be used for the hole injecting layer, but copper (II) phthalocyanide (CuPc), 4,4',4"-Tris(N-3-methylphenyl-N-phenyl-amino)triphenylamine (m-MTDATA), 1-TDATA or 2-TDATA is preferred for the same, each of which has the following formula

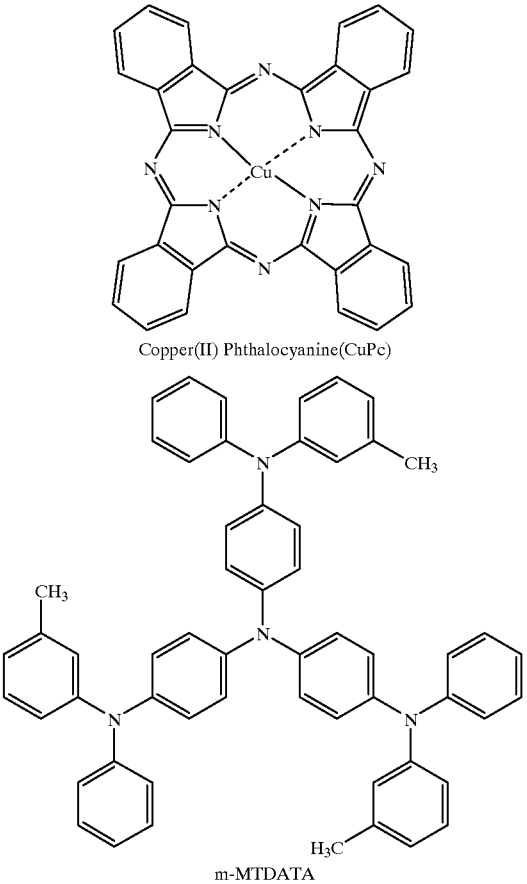

Copper(II) Phthalocyanine(CuPc)

m-MTDATA

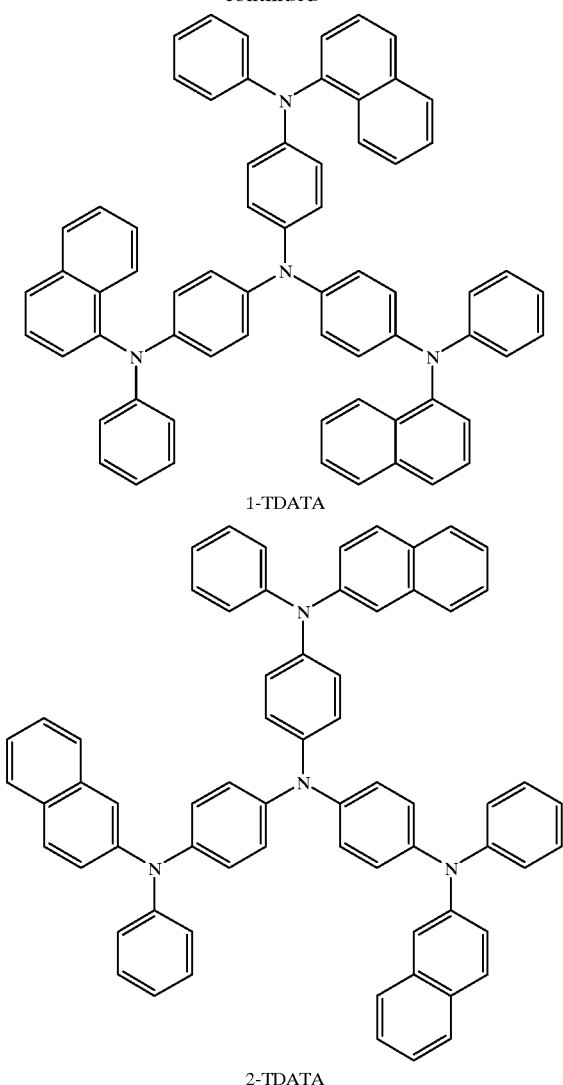

1-TDATA

2-TDATA

The organic EL device according to the present invention may be formed by stacking in sequence the anode, the hole transporting layer, the emitter layer, the electron transporting layer and the cathode as above. In either case, the order of stacking the respective layers may be reversed such that the cathode, the electron transporting layer, the emitter layer, the hole transporting layer and the anode are stacked in sequence.

The present invention will be described in greater detail by means of the following examples. The following examples are for illustrative purposes and not intended to limit the scope of the invention.

SYNTHESIS EXAMPLE 1

Compound having the Formula (2)

The process is illustrated in FIG. 1. 9,9'-dihexylfluorene was initially dissolved in dichloromethane and aluminum chloride was added to the solution. The temperature of the reaction mixture was cooled to −5° C., 4-bromobenzoyl chloride was added dropwise to the mixture and stirred for 1 hour to obtain a compound (A) in a yield of 95%.

(4-bromobenzyl)triphenylphosphonium)bromide was added to the compound (A) and subjected to the Wittig reaction to obtain a compound (B) in an yield of 40%.

Figure 4:
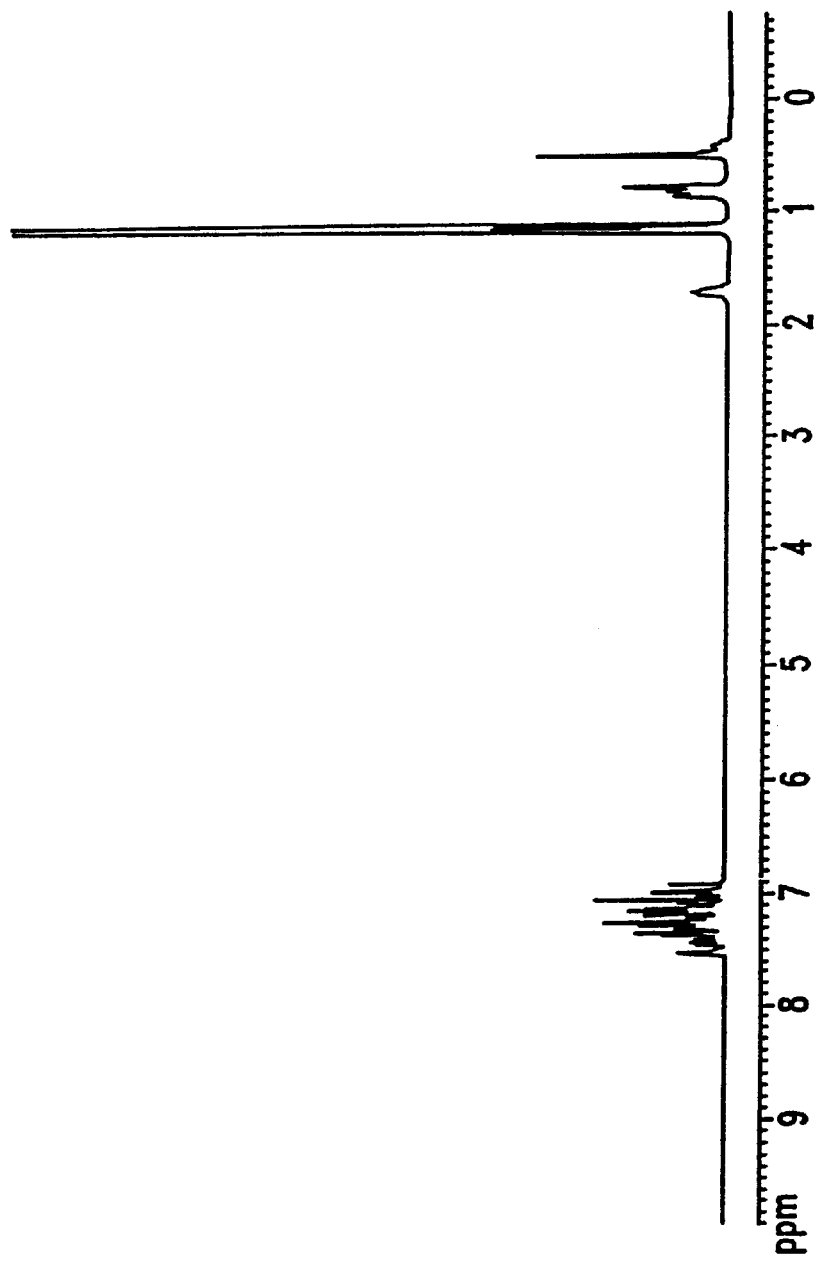
FIG. 4 shows the $^1$H—NMR spectrum of the compound having the formula (2)

The compound (B) was dissolved in tetrahydrofuran (THF) and 2 equiv. of 4-t-butylbenzene boronic acid, tetrakis(triphenylphosphine)palladium and 2 moles of potassium carbonate ($K_2CO_3$) were added to the mixture and reacted for 12 hours under reflux to give the compound having the formula (2) hereinabove in an yield of 90%. The structure of the obtained compound was identified by $^1H$—NMR spectrum, as shown in FIG. 4.

SYNTHESIS EXAMPLE 2

Compound having the Formula (3)

Figure 2:
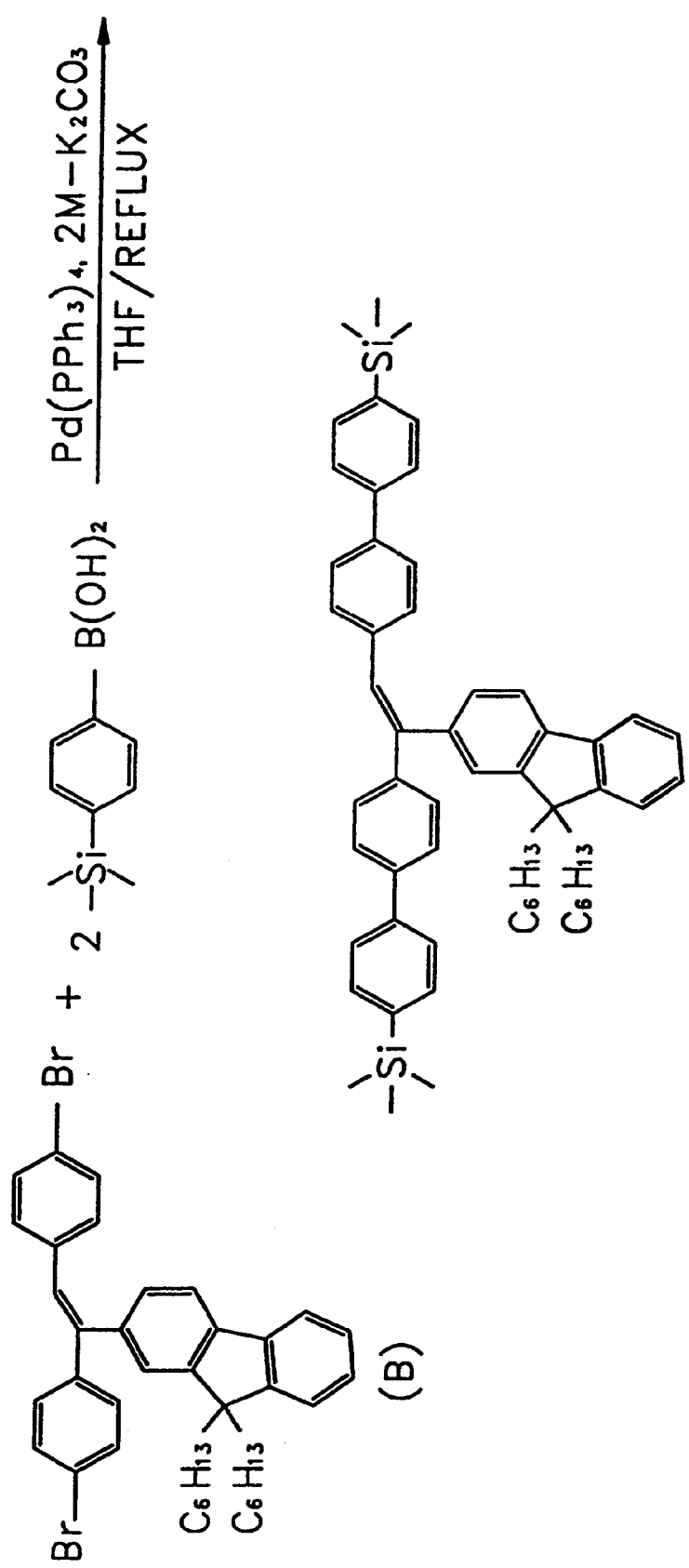
FIG. 2 illustrates a synthesis pathway of the compound having the formula (3)
Figure 5:
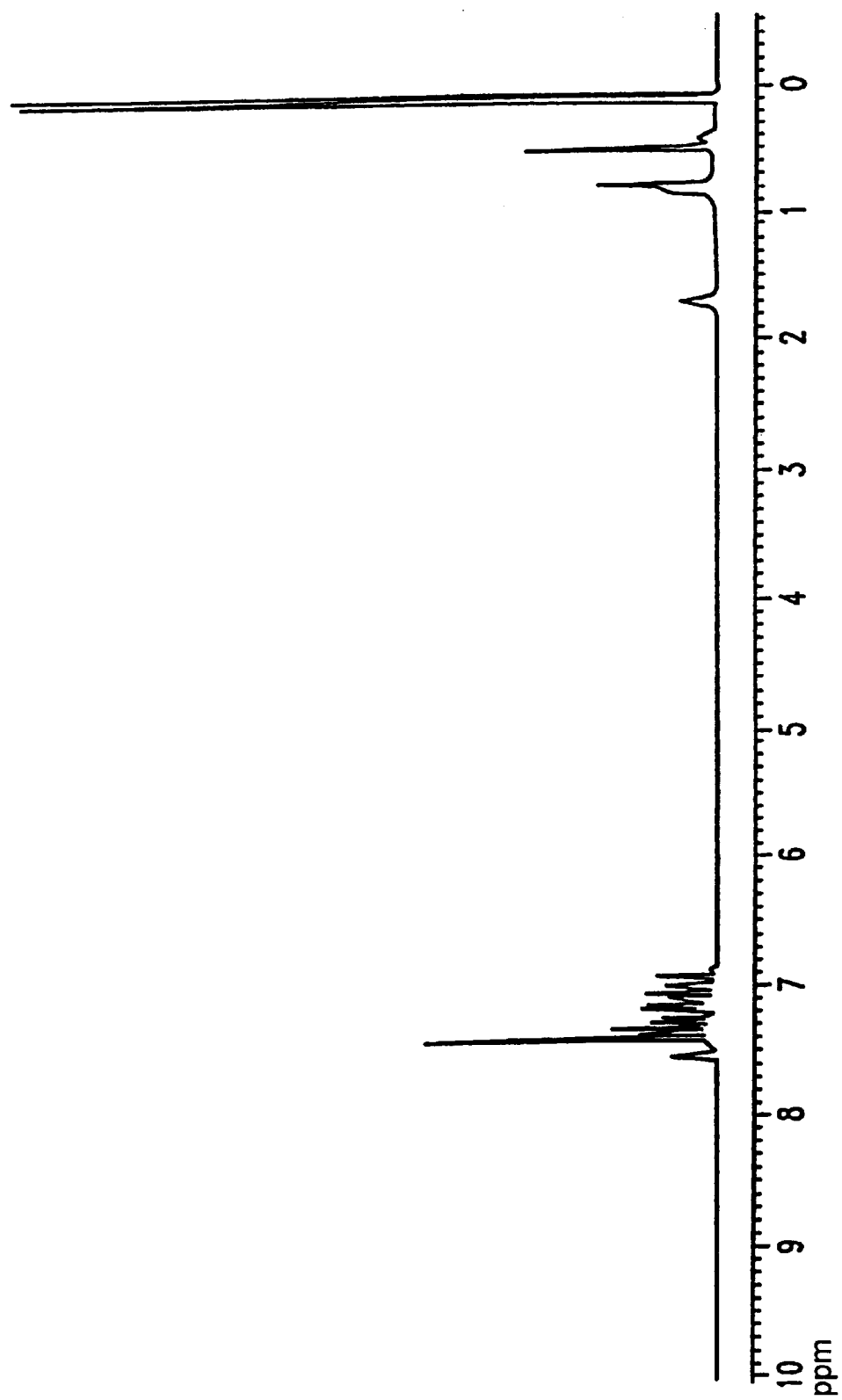
FIG. 5 shows the $^1$H—NMR spectrum of the compound having the formula (3)
Figure 6:
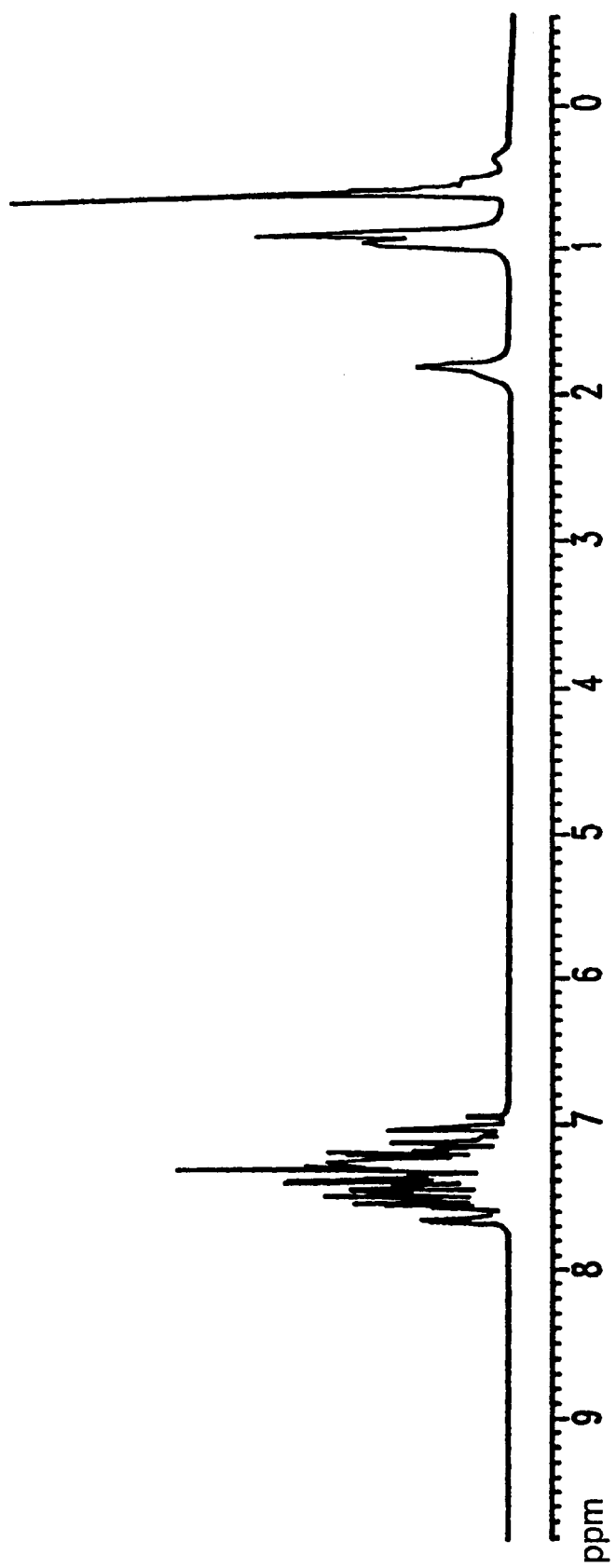
FIG. 6 shows the $^1$H—NMR spectrum of the compound having the formula (4).

The process is illustrated in FIG. 2. After dissolving the compound (B) in THF, 2 equiv. of 4-trimethylsilylbenzene boronic acid, tetrakis(triphenylphosphine)palladium and 2M-$K_2CO_3$ were added to the mixture and reacted under reflux for 12 hours to give the compound having the formula (2) hereinabove in an yield of 90%. The structure of the obtained compound was identified by $^1H$—NMR spectrum, as shown in FIG. 5.

SYNTHESIS EXAMPLE 3

Compound having the Formula (4)

Figure 3:
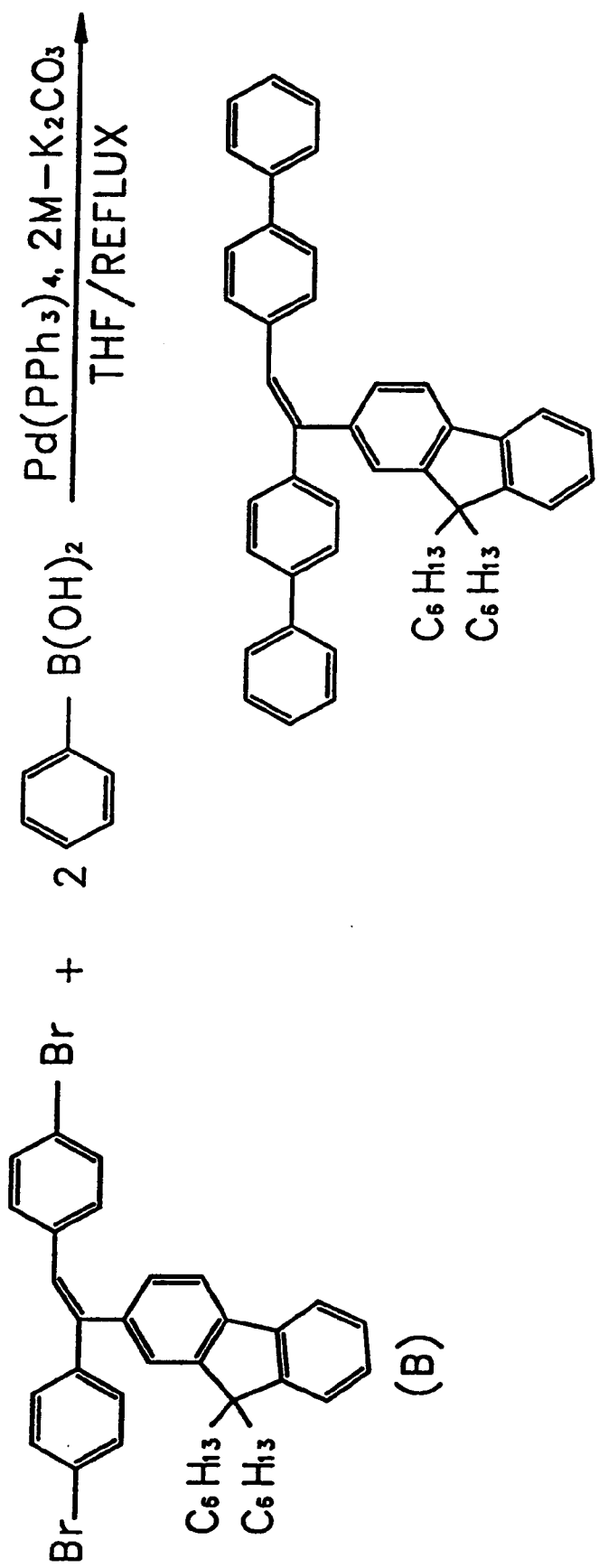
FIG. 3 illustrates a synthesis pathway of the compound having the formula (4)

The process is illustrated in FIG. 3. After dissolving the compound (B) in THF, 2 equiv. of benzene boronic acid, tetrakis(triphenylphosphine)palladium and 2M-$K_2CO_3$ were added to the mixture and reacted under reflux for 12 hours to give the compound having the formula (4) hereinabove in an yield of 90%. The structure of the obtained compound was identified by $^1H$—NMR spectrum, as shown in FIG. 5.

EXAMPLE 1

After forming an electrode of ITO on a glass substrate, N,N'-bis(3-methylphenyl)-N,N'-diphenyl-[1,1'-biphenyl]-4,4'-diamine (TPD) was vacuum deposited on the ITO electrode to form a hole transporting layer having a thickness of 500 Å.

Next, the compound having the formula (2) hereinabove was vacuum deposited on the hole transporting layer to form an emitter layer having a thickness of 280 Å. Then, a compound having the formula (5) hereinbelow was vacuum deposited on the emitter layer to form an electron transporting layer having a thickness of 350 Å. Aluminum and lithium were simultaneously vacuum deposited on the electron transporting layer to form an Al/Li electrode having a thickness of 1,500 Å, resulting in an organic EL device.

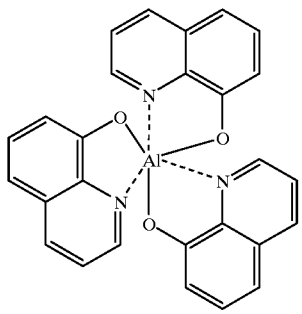

(5)

EXAMPLE 2

After forming an electrode of ITO on a glass substrate, 2-TDATA was vacuum deposited on the ITO electrode to form a hole injecting layer having a thickness of 400 Å, and α-NPD was vacuum deposited on the hole injecting layer to form a hole transporting layer having a thickness of 75 Å thereon.

Next, the compound having the formula (2) hereinabove was vacuum deposited on the hole transporting layer to form an emitter layer having a thickness of 350 Å. Then, the compound having the formula (5) hereinabove was vacuum deposited on the emitter layer to form an electron transporting layer having a thickness of 350 Å. Aluminum and lithium were simultaneously vacuum deposited on the electron transporting layer to form an Al/Li electrode having a thickness of 1,500 Å, resulting in an organic EL device.

EXAMPLE 3

The process of Example 1 was followed except that the compound having the formula (3) hereinabove was used instead of the compound having the formula (2), to fabricate an organic EL device.

EXAMPLE 4

The process of Example 2 was followed except that the compound having the formula (3) hereinabove was used instead of the compound having the formula (2), to fabricate an organic EL device.

Turn-on voltage, L-l efficiency, maximum luminance and color characteristics were measured on the organic EL devices fabricated in Examples 1 through 4. The result is shown in Table. 1.

TABLE 1

| Example No. | Turn-on voltage (V) | L-I efficiency (cd/A) | Maximum luminance (cd/m$^2$) | Color |
|---|---|---|---|---|
| Example 1 | 4 | 3.5 | 16000 | Blue |
| Example 2 | 5 | 2 | 8000 | Blue |
| Example 3 | 4 | 2.5 | 14000 | Blue |
| Example 4 | 5 | 2 | 7000 | Blue |

Table 1 shows the organic EL devices fabricated in Examples 1 through 4 can display blue and have good properties in terms of L-l efficiency, turn-on voltage and luminance.

The compound having the formula (1) hereinabove according to the present invention, as a blue light-emitting substance, is useful as a color developing substance for a display device with improved emission efficiency.

The organic EL device according to the present invention adopts the compound having the formula (1) for its organic layer, for example, the emitter layer, which results in improved emission efficiency and luminance, compared to common blue light-emitting compounds.

While this invention has been particularly shown and described with reference to preferred embodiments thereof, it will be understood by those skilled in the art that various changes in form and details may be made therein without departing from the spirit and scope of the invention as defined by the appended claims.

What is claimed is:
1. A blue light-emitting compound having fluorene side chains, the compound having the formula (1)

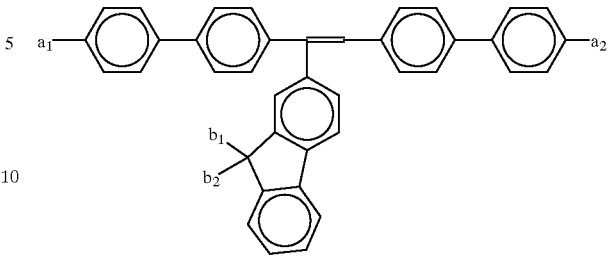

(1)

where $a_1$ and $a_2$ are independently selected from the group consisting of alkyl group of 1 to 20 carbon atoms, —SiR$_3$, and hydrogen;
   $b_1$ and $b_2$ are independently selected from the group consisting of alkyl group of 1 to 20 carbon atoms, aryl group of 6 to 20 carbon atoms, and —SiR$_3$; and
   R is alkyl group of 1 to 10 carbon atoms.
2. The blue-light emitting compound of claim 1, wherein $a_1$ and $a_2$ are independently selected from the group consisting of t-butyl group and trimethylsilyl; and
   $b_1$ and $b_2$ are independently selected from the group consisting of methyl, ethyl, propyl, butyl, pentyl, hexyl, heptyl, octyl, nonyl, decyl, dodecyl and phenyl groups.
3. The blue-light emitting compound of claim 1, wherein $a_1$ and $a_2$ are both t-butyl group, and $b_1$ and $b_2$ are both hexyl group.
4. The blue-light emitting compound of claim 1, wherein $a_1$ and $a_2$ are both trimethylsilyl group, and $b_1$ and $b_2$ are both hexyl group.
5. The blue-light emitting compound of claim 1, wherein $a_1$ and $a_2$ are both hydrogen, and $b_1$ and $b_2$ are both hexyl group.
6. An organic electroluminescence device having an organic layer between a pair of electrodes, wherein the organic layer comprises a compound with fluorene side chains, the compound having the formula (1)

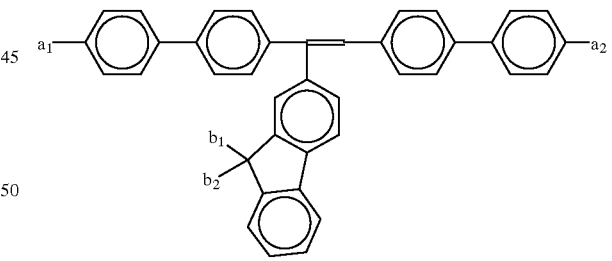

(1)

where $a_1$ and $a_2$ are independently selected from the group consisting of alkyl group of 1 to 20 carbon atoms, —SiR$_3$ and hydrogen;
   $b_1$ and $b_2$ are independently selected from the group consisting of alkyl group of 1 to 20 carbon atoms, aryl group of 6 to 20 carbon atoms, and —SiR$_3$; and
   R is alkyl group of 1 to 10 carbon atoms.
7. The organic electroluminescence device of claim 6, wherein $a_1$ and $a_2$ are independently selected from the group consisting of t-butyl group and trimethylsilyl; and
   $b_1$ and $b_2$ are independently selected from the group consisting of methyl, ethyl, propyl, butyl, pentyl, hexyl, heptyl, octyl, nonyl, decyl, dodecyl and phenyl groups.

8. The organic electroluminescence device of claim 6, wherein $a_1$ and $a_2$ are both t-butyl group, and $b_1$ and $b_2$ are both hexyl group.

9. The organic electroluminescence device of claim 6, wherein $a_1$ and $a_2$ are both trimethylsilyl group, and $b_1$ and $b_2$ are both hexyl group.

10. The organic electroluminescence device of claim 6, wherein $a_1$ and $a_2$ are both hydrogen, and $b_1$ and $b_2$ are both hexyl group.

11. The organic electroluminescence device of claim 6, wherein the organic layer is an emitter layer.

12. A display device comprising the electroluminescence device of claim 6.

13. A display device comprising the electroluminescence device of claim 7.

14. A display device comprising the electroluminescence device of claim 8.

15. A display device comprising the electroluminescence device of claim 9.

16. A display device comprising the electroluminescence device of claim 10.

17. A display device comprising the electroluminescence device of claim 11.

* * * * *